United States Patent [19]

Clendening

[11] 4,380,815
[45] Apr. 19, 1983

[54] SIMPLIFIED NRZ DATA PHASE DETECTOR WITH EXPANDED MEASURING INTERVAL

[75] Inventor: Steven J. Clendening, Plano, Tex.

[73] Assignee: Rockwell International Corporation, El Segundo, Calif.

[21] Appl. No.: 238,176

[22] Filed: Feb. 25, 1981

[51] Int. Cl.³ .................... H03K 1/17; H03K 5/156
[52] U.S. Cl. .................. 375/80; 375/120; 328/133; 307/516
[58] Field of Search ............ 375/81, 82, 100, 80, 375/120; 307/516, 517, 527, 528; 329/50, 122; 328/133, 134, 62, 63, 155, 206, 207; 360/39, 51

[56] References Cited

U.S. PATENT DOCUMENTS

| | | | |
|---|---|---|---|
| 3,846,708 | 11/1974 | Franco | 375/82 |
| 3,922,610 | 11/1975 | Buchan et al. | 328/134 |
| 3,986,125 | 10/1976 | Eibner | 328/109 |
| 3,992,581 | 11/1976 | Davis | 375/120 |
| 3,995,225 | 11/1976 | Horn | 328/111 |
| 4,191,976 | 3/1980 | Braun | 360/51 |
| 4,222,009 | 9/1980 | Moulton et al. | 375/120 |

*Primary Examiner*—Benedict V. Safourek
*Assistant Examiner*—Stephen Chin
*Attorney, Agent, or Firm*—Terry M. Blackwood; Michael E. Taken; Howard R. Greenberg

[57] ABSTRACT

A simplified digital NRZ data phase detector is provided with a minimum number of components and with an expanded measuring interval to enable the use of slower speed components. In a phase locked loop application, a first input gate, such as a flip-flop, responds to NRZ data, and a second input gate responds to clock pulses and the output of the first gate. Variable and fixed width correction signals are derived directly from the outputs of the first and second gates, respectively, within a measuring interval initiated by a data transition and terminated by a clock transition. The difference in duration between the directly derived variable and fixed pulses provides phase indication.

17 Claims, 13 Drawing Figures

SIMPLIFIED NRZ DATA PHASE DETECTOR WITH EXPANDED MEASURING INTERVAL

TECHNICAL FIELD

The invention relates to digital phase detectors for NRZ (non-return-to-zero) data, for example suitable for clock recovery apparatus, such as a phase locked loop, for deriving clock pulses from an NRZ data stream. The invention more particularly relates to a simplified NRZ data phase detector with an expanded measuring interval enabling the use of slower speed components.

BACKGROUND

In an NRZ data stream, a data pulse stays at one level or another for the entire duration of a bit interval, i.e., for one full clock cycle. For example, a sequence of three consecutive 1's is presented by a constant level signal lasting three bit intervals, or three clock cycles. This is in contrast to an RZ (return-to-zero) data stream wherein a digital 1 is represented by a pulse which does not last the entire bit interval but rather returns to zero. For example, a sequence of three consecutive 1's in an RZ data stream is presented by three consecutive distinct pulses, each lasting one-half bit interval or clock cycle and returning to zero for the remainder of its clock cycle.

In both NRZ and RZ data streams, it is necessary to have a train of clock pulses providing timing information for demarcation of bit intervals in the identification of 1's and 0's in the data stream. In a communication system, it may be necessary to derive or "recover" clock pulses from the occurrence of the received data pulses.

One kind of circuit used to recover clock pulses from a data stream is a phase locked loop. In this type of circuit, a voltage controlled oscillator (VCO) generates clock pulses which are fed together with received data pulses to a phase detector. The phase detector generates a voltage which is some function of the difference in phase between the data and the clock. The voltage from the phase detector drives the voltage controlled oscillator to produce clock pulses which stay in phase with the data pulses.

There are various types of apparatus for deriving clock pulses from RZ data, and include a variety of phase detectors. In one type of phase detector for RZ data, a measuring interval is initiated by a data transition and is terminated by the opposite data transition one-half clock cycle later. The relative time of occurrence of a clock transition within this measuring interval gives an indication of the phase difference between the data and the clock. The duration from a rising data edge to a clock transition is compared against the duration from that clock transition to the falling data edge, and the duration difference corresponds to phase differential. Since each data pulse returns to zero during its bit interval, the falling data edge transition may be used to terminate the measuring interval.

In an NRZ data stream, the falling data edge transition may not be used to terminate the measuring interval because it is not known when such transition will occur. For example, if the next bit is a zero, then the data will transit low at the end of the current bit interval; but if the next data bit is a 1, then the data will stay high and no data edge transition will occur at the end of the current bit interval. In an RZ data stream, a data 1 transits high and then low all within one bit interval (the data pulse has a duration of one-half clock cycle). If the next data bit is also a 1 then the data will again transit high and then low. The falling data edge in an RZ data stream may thus be used to terminate the measuring interval because it is known that such edge transition will occur within the bit interval and one-half clock cycle after the rising data edge. In an NRZ data stream, the time of occurrence of the falling data edge is indeterminate and hence not suitable for providing a known relative timing reference.

Various phase detection schemes have been attempted for NRZ data. An analog approach to NRZ data phase detection involves the use of a differentiator receiving NRZ data and generating positive and negative analog pulses in response to data edges. These analog pulses are typically half or full wave rectified and then fed together with recovered clock pulses to a multiplier mixer whose output is the phase error control to the VCO. This multiplier mixer is typically complex and expensive, particularly at high frequency data rates where transformers may become necessary.

A digital approach to NRZ data phase detection involves the use of a monostable one-shot multivibrator for receiving NRZ data and converting data edges to unidirectional digital pulses. These digital pulses are fed together with recovered clock pulses to a multiplier such as an exclusive OR gate, whose output is the phase error control to the VCO. This multiplier is simpler and less expensive than the above noted analog multiplier. However, a number of problems are presented with the use of the one-shot multivibrator. One-shot multivibrators are prone to variation in output pulse width due to temperature and aging. This affects the clock and data phase relationship and may cause errors in retiming the data with the recovered clock. The pulse width generally becomes a greater problem as the data rate increases, since factors affecting timing become more critical. The phase of the recovered clock in many applications requires correction in order to retime the data correctly. Furthermore, since the one-shot multivibrator produces a pulse of fixed width, the pulse width must be adjusted to the data rate at which the phase detector is to be used.

A digital NRZ data phase detector which solves the above problems has been provided by phase error circuitry which generates a measuring interval initiated by a data transition and terminated not by the opposite data transition, but rather by a clock transition. Termination of the measuring interval is not dependent upon the indeterminate time of occurrence of a falling data edge in an NRZ data stream. The measuring interval is composed of a variable duration subinterval and a fixed duration subinterval. The variable duration subinterval is provided by a variable duration pulse which is generated with a length equal to the time between a data transition and a given clock transition. The fixed duration subinterval is provided by a fixed duration pulse which is generated with a length equal to the duration between the given clock transition and the immediately succeeding clock transition of opposite polarity. The fixed duration pulse has a length equal to the duration of one clock pulse, i.e., one-half clock cycle.

The latter mentioned NRZ digital data phase detector has a first gate responsive to incoming NRZ data, and a second gate responsive to the output of the first gate and to the clock. Output logic gating circuitry responds to the outputs of the first and second gates and generates the variable duration pulse and then the fixed duration pulse. This output gating circuitry initiates the variable duration pulse and the measuring interval concurrently in response to the data transition. In response to the next clock transition of one polarity, the output gating circuitry terminates the variable duration pulse and simultaneously initiates the fixed duration pulse. In response to the immediately succeeding clock transition of opposite polarity, the output gating circuitry terminates the fixed duration pulse and the measuring interval.

The present invention relates to improvements over the latter mentioned NRZ digital data phase detector. One improvement involves circuit simplification and elimination of the output gating circuitry. Another improvement involves expansion of the measuring interval, enabling slower speed components to be used.

SUMMARY

The present invention provides an improved digital phase detector for NRZ data phase detection, particularly characterized in its simplicity and efficiency.

The invention enables the provision of a digital NRZ data phase detector with a minimum number of components and with an expanded measuring interval to enable the use of slower speed components. A first input gate responds to NRZ data, and a second input gate responds to clock pulses and to the output of the first gate. Variable and fixed width correction signals are derived directly from the first and second input gates, eliminating output logic gating circuitry otherwise responsive to the first and second gates for conditionally outputting the variable and fixed width signal pulses. The difference in duration between the directly derived variable and fixed width signal pulses provides phase indication. The measuring interval is expanded by lengthening the duration of the fixed width correction signal pulse.

DETAILED DESCRIPTION

Figure 1:
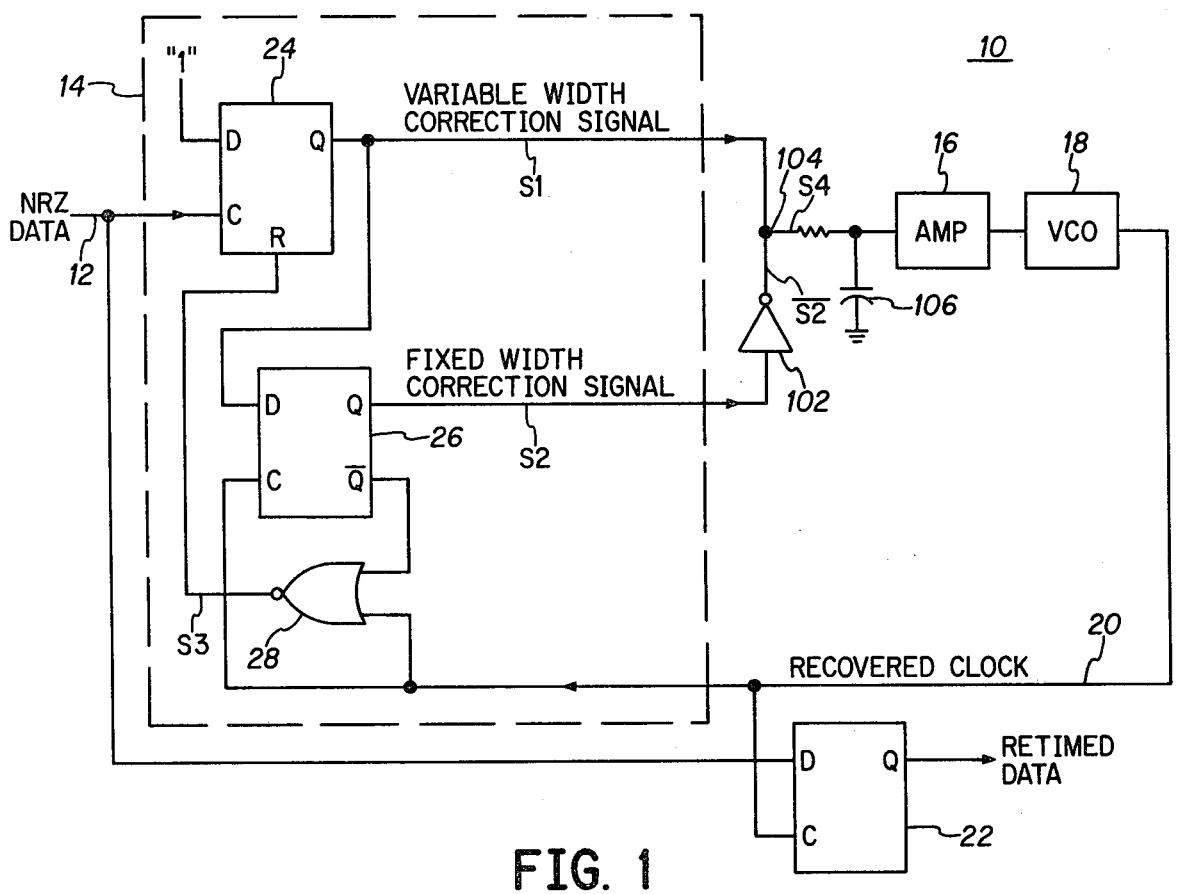
FIG. 1 is a schematic circuit diagram of a phase locked loop for clock recovery from an NRZ data stream for retiming the data, and including a digital phase detector constructed in accordance with the invention.

There is shown in FIG. 1 a phase locked loop 10 for extracting clocking information from an NRZ data stream 12, and including a digital phase detector 14 constructed in accordance with the invention. Phase detector 14 receives the NRZ data and outputs a composite phase error signal which is amplified by amplifier 16 and fed to a voltage controlled oscillator (VCO) 18 which generates output clock pulses having a frequency dependent upon the input control voltage. The output 20 of VCO 18 is the recovered or extracted clock which is fed back to phase detector 14 for comparison against the NRZ data. Phase detector 14 generates a phase error output signal corresponding to the difference in phase between the NRZ data 12 and the recovered clock 20. This new phase error output signal is amplified by amplifier 16 and fed to VCO 18 which adjusts the output frequency on 20 in response thereto. The recovered clock 20 and the NRZ data 12 may be fed to a retiming flip-flop 22 which outputs retimed data edge aligned with the recovered clock.

The present invention relates to phase detector 14 shown in dashed line in FIG. 1. Phase detector 14 has a first gate provided by flip-flop 24, and a second gate provided by flip-flop 26. Flip-flop 24 has a D input connected to a high or digital 1 logic state, and a C (clock) input receiving the NRZ data from line 12. Flip-flop 26 has a D input connected to the Q output of flip-flop 24, and a C input receiving clock pulses from line 20. The Q output of flip-flop 24 generates a signal S1, and the Q output of flip-flop 26 generates a signal S2. A reset gate is provided by a NOR gate 28 having one input connected to the $\overline{Q}$ output of flip-flop 26 and another input receiving clock pulses from line 20. The output of NOR gate 28 is connected to the R (reset) input of flip-flop 24.

Figures 2, 3, 4:
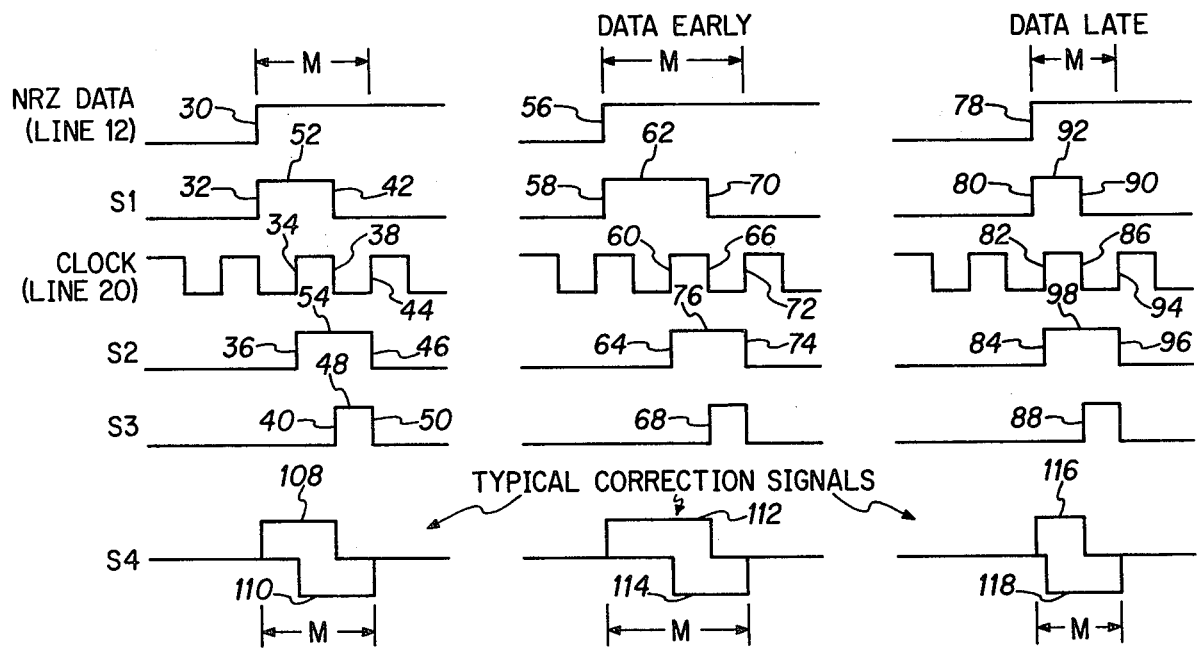
FIGS. 2 through 4 are timing diagrams illustrating operation of the circuit of FIG. 1.

Referring to FIG. 2, a positive going data transition 30 causes the Q output S1 of flip-flop 24 to transition high at 32. At the next positive clock transition, which is edge 34, the high state of the Q output S1 of flip-flop 24 is clocked through flip-flop 26 such that its Q output S2 transitions high at 36. At the next negative transition of clock 20, which is edge 38, the output of NOR gate 28, designated signal S3, transitions high at 40. This is because the Q output S2 of flip-flop 26 is high and hence the $\overline{Q}$ output of flip-flop 26 is low and because the other input to NOR gate 28, clock 20, has just transitioned low. Both inputs to NOR gate 28 are thus low and hence S3 transitions high at 40. The reset pulse in S3 initiated at 40 resets flip-flop 24, causing its Q output S1 to transition low at 42. At the next positive clock transition, which is edge 44, the low state of the Q output S1 of flip-flop 24 is clocked through flip-flop 26 such that its Q output S2 transitions low at 46. Reset pulse 48 transitions low at 50 due to positive clock transition 44.

Pulse 52 in signal S1 has a variable duration depending upon the time of occurrence of data transition 30. Pulse 54 in signal S2 has a fixed duration which lasts between designated clock transitions of common polarity, namely positive clock transitions 34 and 44. Pulse 54 thus lasts for one full clock cycle. In FIG. 2, the width of pulse 52 is equal to the width of pulse 54, and in particular the embodiment of FIG. 1, this indicates an in-phase condition. Correction signals S1 and S2 are derived directly from input gates 24 and 26.

FIG. 3 illustrates timing conditions when the data occurs early, i.e., the clock pulses from 20 occur late with respect to the NRZ data on line 12. Positive data transition 56 causes S1 to transition high at 58. At the next positive clock transition, which is edge 60, the high state of S1 pulse 62 is clocked through flip-flop 26 such that its Q output S2 transitions high at 64. At the next negative clock transition, which is edge 66, S3 transitions high at 68, whereby S1 transitions low at 70 and variable width pulse 62 is terminated. At the next positive clock transition, which is edge 72, S2 transitions low at 74 to terminate fixed width pulse 76 on S2. Comparing FIGS. 2 and 3, it is seen that the S1 variable width pulse 62 is longer than variable pulse 52. The duration of S2 fixed width pulse 76 is equal to the duration of fixed width pulse 54. In FIG. 3, it is seen that variable width pulse 62 is now longer than fixed width pulse 76, which provides phase indication.

FIG. 4 illustrates timing conditions when the data is late, i.e., clock pulses from 20 occur early with respect to NRZ data from 12. Positive data transition 78 causes S1 to transition high at 80. At the next positive clock transition 82, S2 transitions high at 84. At the next negative clock transition 86, S3 transitions high at 88 which causes S1 to transition low at 90 to terminate variable width pulse 92. At the next positive clock transition 94, S2 transitions low at 96 to terminate fixed width pulse 98. Variable duration pulse 92 is now shorter than fixed duration pulse 98, which provides phase indication.

Referring to FIGS. 2 through 4, it is thus seen that the difference in duration between the variable length pulse in signal S1 and the fixed length pulse in signal S2 provides phase indication. The S1 and S2 signals from phase detector 14 in FIG. 1 may be used in a variety of ways as phase correction signals in phase locked loop applications.

In the particular application of FIG. 1, the S1 and S2 signals are averaged such that any net positive or negative charge will change the input control voltage to VCO 18 so as to compensatingly adjust the output frequency of clock pulses on line 20. Signal S2 is inverted by inverter 102 and combined with signal S1 to yield a signal on line 104, designated S4, shown in FIG. 2. An integrating or averaging capacitor 106 is provided for signal S4 prior to amplification by amplifier 16. Signal S4 charges capacitor 106 positively at 108 due to variable length pulse 52 in signal S1. Signal S4 charges capacitor 106 negatively at 110 due to the inversion of fixed length pulse 54 in S2. The average or net charge resulting from pulses 108 and 110 is zero, and thus there is no adjustment made to the input control voltage to the VCO and hence the output frequency of clock pulses 20 remains the same.

In FIG. 3, positive pulse 112 in signal S4 is due to pulse 62 in signal S1, and negative pulse 114 in S4 is due to the inversion of pulse 76 in S2. Since positive pulse 112 is longer than negative pulse 114, there is a net positive charge on capacitor 106. This increases the input control voltage to the VCO which in turn increases the output clock pulse frequency, whereby to effect earlier occurrence of the clock pulses and bring the NRZ data 12 and clock 20 back into phase.

In FIG. 4, positive pulse 116 in S4 is due to pulse 92 in S1, and negative pulse 118 in S4 is due to the inversion of pulse 98 in S2. Since negative pulse 118 is longer than positive pulse 116, there is a net negative charge on capacitor 106, which in turn reduces the VCO output frequency to cause the clock pulses on line 20 to occur slightly later and thus bring the data and clock back into phase.

Figure 5:
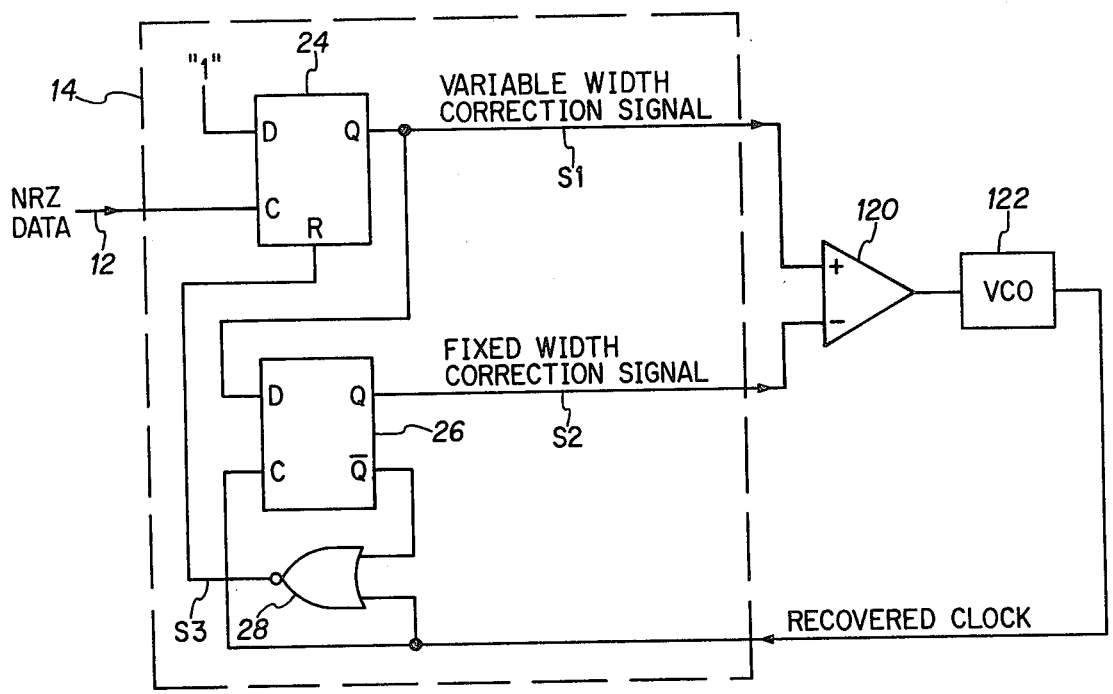
FIG. 5 is an alternate embodiment of the circuit of FIG. 1.

Another application of the variable and fixed width correction signals S1 and S2 of FIG. 1 is shown in FIG. 5. In a particularly desirable aspect of the embodiment of FIG. 5, the correction signals S1 and S2 are not only derived directly from the first and second input gates provided by flip-flops 24 and 26, but are also delivered directly to the plus and minus terminals of a differential amplifier 120 feeding VCO 122.

Referring again to FIG. 2, it is noted that the phase error circuitry responds to a data transition 30, FIG. 2, for initiating a measuring interval M, and responds to a clock transition 44 for terminating the measuring interval. A variable length subinterval 52 is generated between data transition 30 and a given polarity clock transition 38. A fixed length subinterval 54 is generated between designated common polarity clock transitions 34 and 44 such that the fixed subinterval has a duration of one full clock cycle. The duration difference between variable subinterval 52 and fixed subinterval 54 provides phase indication. Fixed subinterval 54 is initiated and terminated by clock transitions 34 and 44 of opposite polarity to the given polarity clock transition 38 which terminates the variable subinterval 52. While the measuring interval M is initiated by a positive data transition, the termination of measuring interval M is independent of the time of occurrence of a falling data edge. Unlike an RZ data stream, it is not known when a falling edge in an NRZ data stream will occur, and hence the measuring interval is terminated by a clock transition, not a falling data edge.

Figure 6:
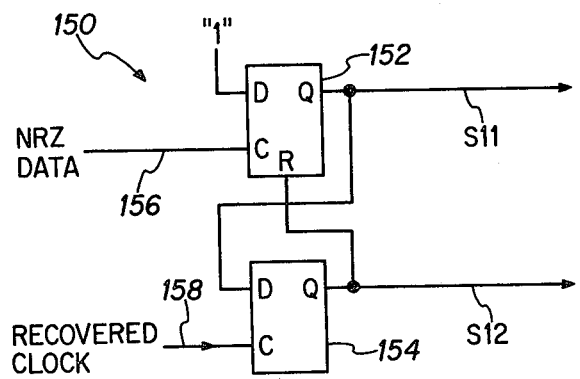
FIG. 6 is a schematic circuit diagram of an alternate embodiment of the phase detector of FIG. 1.

FIG. 6 shows a phase detector 150 which is an alternate embodiment of phase detector 14 of FIG. 1. Variable and fixed width correction signals S1 and S2 of FIG. 1 have counterparts S11 and S12 in FIG. 6. A first input gate is provided by flip-flop 152, and a second input gate is provided by flip-flop 154. Flip-flop 152 has a D input connected to a digital 1 logic state, and a C input receiving NRZ data from line 156. The Q output of flip-flop 152 provides signal S11 and is also connected to the D input of flip-flop 154. Flip-flop 154 has a C input receiving clock pulses from the recovered clock line 158, and has a Q output providing signal S12 and also connected to the R input of flip-flop 152.

Figure 7:
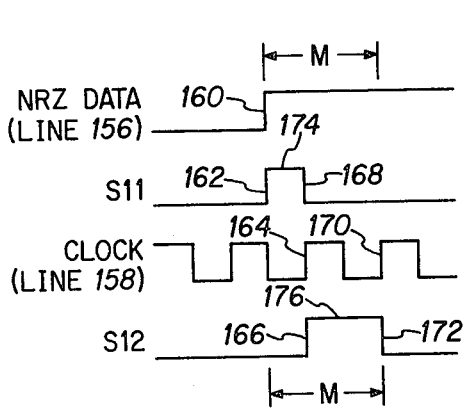
FIGS. 7 through 9 are timing diagrams illustrating operation of the circuit of FIG. 6.

Referring to FIG. 7, positive data transition 160 causes S11 to transition high at 162. At the next positive clock transition, which is edge 164, the high state of the Q output S11 of flip-flop 152 is clocked through flip-flop 154 such that its Q output S12 goes high at 166. Since the Q output of flip-flop 154 is connected to the reset input of flip-flop 152, the positive transition of S12 resets flip-flop 152 such that S11 transitions low at 168. At the next positive clock transition, which is edge 170, the low state of S11 is clocked through flip-flop 154 such that S12 transitions low at 172.

Pulse 174 in S11 has a variable duration dependent upon the time of occurrence of data transition 160. Pulse 176 in S12 has a fixed duration of one full clock cycle between clock transitions 164 and 170. The timing conditions in FIG. 7 represent an in-phase condition between the recovered clock and the NRZ data. For the particular embodiment of FIG. 6, this in-phase condition is represented by pulse 174 having a length one-half the length of pulse 176, i.e., a ratio of 1:2 between the duration of variable width correction signal S11 and the duration of fixed width correction signal S12 indicates an in-phase condition. In FIG. 7, the duration difference between pulse 176 and 174 is one-half clock cycle. Depending upon the application of correction signals S11 and S12, it may be desirable to provide an offset in signal S11 to compensate its smaller pulse width for the in-phase condition.

Figure 8:
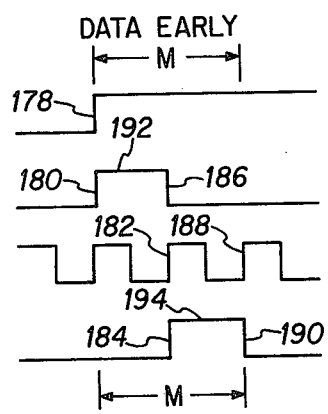

FIG. 8 shows operation of the circuit of FIG. 6 when the data is early, i.e., the recovered clock pulses on line 158 are late with respect to the NRZ data on line 156. Data transition 178 causes S11 to transition high at 180. At the next positive clock transition 182, S12 transitions high at 184 which in turn causes S11 to transition low at 186. At the next positive clock transition 188, S12 transitions low at 190. Variable length pulse 192 now has a duration of one full clock cycle and is equal to the duration of fixed length pulse 194. This represents an out-of-phase condition between the data and the clock because the duration difference between pulses 194 and 192 is no longer one-half clock cycle as in FIG. 7.

Figure 9:
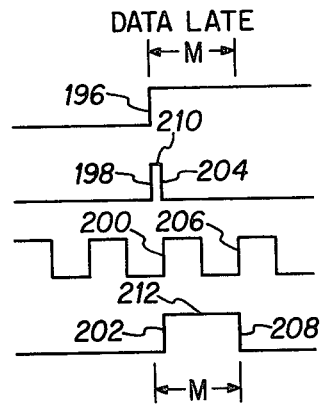

FIG. 9 illustrates operation of the circuit of FIG. 6 when the data occurs late, i.e., the clock pulses from line 158 occur early with respect to the NRZ data on line 156. Positive data transition 196 causes S11 to transition high at 198. At the next positive clock transition 200, S12 transitions high at 202, which in turn causes S11 to transition low at 204. At the next positive clock transition 206, S12 transitions low at 208. Variable length pulse 210 in S11 is now less than one-half the duration of fixed length pulse 212 in S12. The difference in duration between pulses 212 and 210 is less than one-half clock cycle, which indicates a phase error caused by a leading clock.

Figure 10:
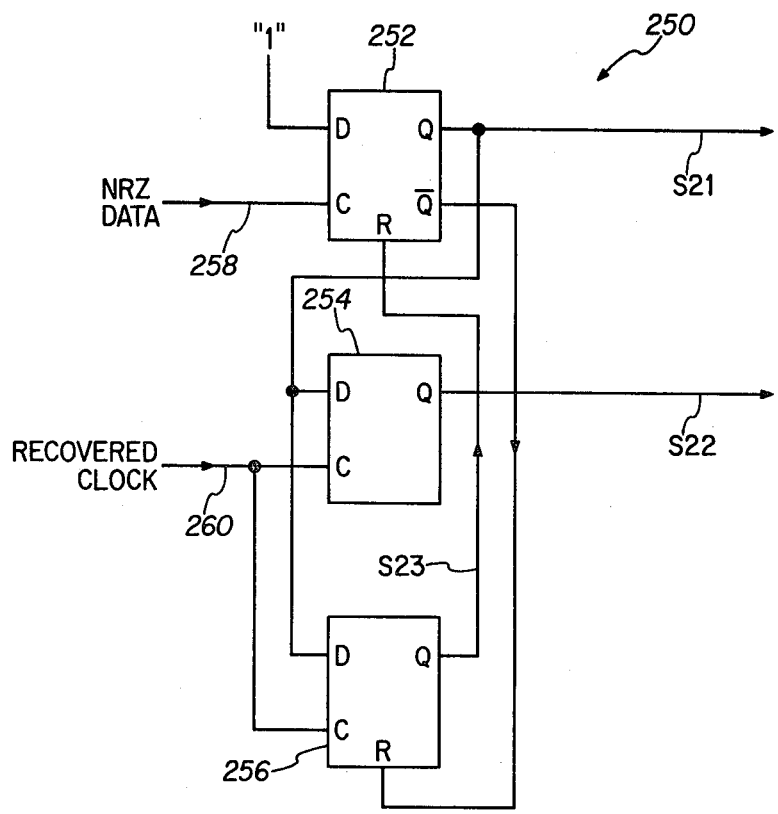
FIG. 10 is a schematic circuit diagram of another alternate embodiment of the phase detector of FIG. 1.

FIG. 10 shows another alternate embodiment phase detector 250. The variable and fixed width correction signals S1 and S2 of FIG. 1 have counterparts designated S21 and S22 in FIG. 10.

In FIG. 10, phase detector 250 has a first input gate provided by flip-flop 252, a second input gate provided by flip-flop 254 and a reset gate provided by flip-flop 256. Flip-flop 252 has a D input connected to a digital 1 logic state and a C input receiving NRZ data from line 258. Flip-flop 252 has a Q output providing variable width correction signal S21, and is also connected to the D inputs of flip-flops 254 and 256. The $\overline{Q}$ output of flip-flop 252 is connected to the R input of flip-flop 256. The recovered clock signal on line 260 is delivered to the C inputs of flip-flops 254 and 256. Flip-flop 254 has a Q output supplying fixed width correction signal S22. The Q output of flip-flop 256 is connected to the R input of flip-flop 252.

Figures 11, 12, 13:
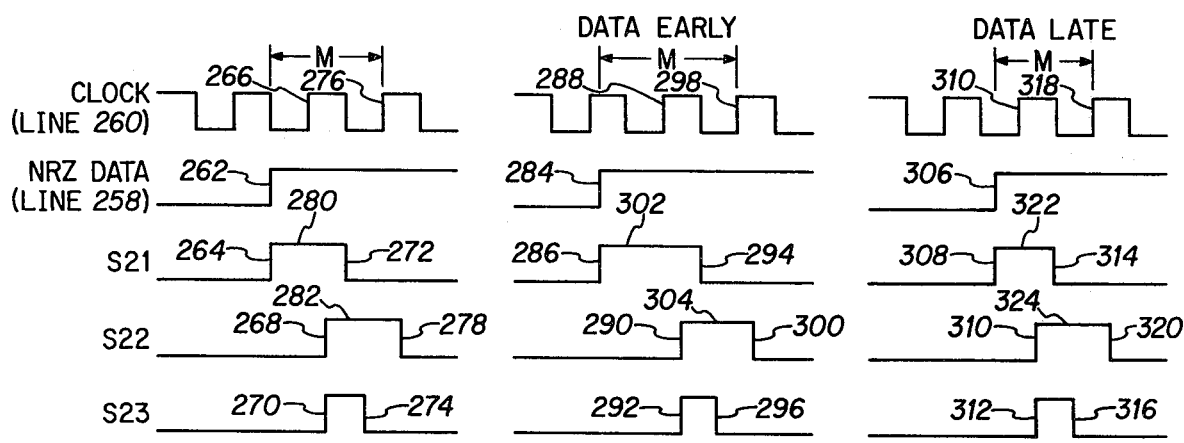
FIGS. 11 through 13 are timing diagrams illustrating operation of the circuit of FIG. 10.

Referring to FIG. 11, positive data transition 262 causes S21 to transition high at 264. At the next positive clock transition 266, S22 and S23 transition high at 268 and 270. S23 is the Q output of flip-flop 256. The positive transition of S23 resets flip-flop 252 such that S21 transitions low at 272. When the Q output S21 of flip-flop 252 goes low at 272, the $\overline{Q}$ output of flip-flop 252 goes high which resets flip-flop 252 such that its Q output S23 goes low at 274. At the next positive clock transition 276 following edge 266, the low state of the Q output S21 of flip-flop 252 is clocked through flip-flop 254 such that its Q output S22 goes low at 278.

In FIG. 11, variable length pulse 280 in S21 is equal in duration to fixed length pulse 282 in S22, indicating an in-phase condition.

FIG. 12 shows operation of the circuit of FIG. 10 when the data is early, i.e., the recovered clock pulses on line 260 are late with respect to the NRZ data on line 258. Positive data transition 284 causes S21 to transition high at 286. At the next positive clock transition 288, S22 and S23 transition high at 290 and 292. Positive transition 292 in S23 resets flip-flop 252 such that S21 transitions low at 294. The Q output of flip-flop 252 transitions high to thus reset flip-flop 256 whereby S23 transitions low at 296. At the next positive clock transition 298 following edge 288, S22 transitions low at 300. Variable length pulse 302 in S21 is now longer than fixed length pulse 304 in S22, indicating an out-of-phase condition with a lagging clock.

FIG. 13 illustrates operation of the circuit of FIG. 10 when the data is late, i.e., the recovered clock pulses on line 260 are early with respect to the NRZ data on line 258. Positive data transition 306 causes S1 to transition high at 308. At the next positive clock transition 310, the high state of the Q output S21 of flip-flop 252 is clocked through flip-flips 254 and 256 such that S22 and S23 transition high at 310 and 312. Positive transition 312 of S23 resets flip-flop 252 such that S21 transitions low at 314 and the $\overline{Q}$ output of flip-flop 252 transitions high to reset flip-flop 256 such that its Q output S23 transitions low at 316. At the next positive clock transition 318 following edge 310, the low state of the Q output S21 of flip-flop 252 is clocked through flip-flop 254 such that S22 transitions low at 320. Variable length pulse 322 in S21 is now shorter than fixed length pulse 324 in S22, indicating an out-of-phase condition with a leading clock.

As seen in FIGS. 11 through 13, a measuring interval M is initiated by a data transition and terminated by a clock transition. Within the measuring interval M, there is a variable duration subinterval provided by the pulse on S21, and a fixed duration subinterval provided by the pulse on S22. The variable duration subinterval is initiated concurrently with the measuring interval. The fixed duration subinterval is terminated concurrently with the measuring interval M. The variable duration subinterval and the fixed duration subinterval are partially overlapped because the pulses on S21 and S22 overlap, i.e., the pulse on S21 is terminated after the pulse on S22 is initiated. The measuring interval M in FIG. 11 lasts one and one-half clock cycles. The measuring interval M in FIG. 12 is longer because variable duration subinterval 302 is longer than variable duration subinterval 280. The measuring interval M in FIG. 13 is shorter than the measuring interval in FIG. 11 because variable duration subinterval 322 is shorter than variable duration subinterval 280. Fixed duration subintervals 282 in FIG. 11, 304 in FIG. 12, and 324 in FIG. 13 all have the same duration, namely one full clock cycle.

In FIGS. 7 through 9, the variable and fixed duration subintervals do not overlap because the variable length pulse on S11 is terminated simultaneously with the initiation of the fixed duration pulse on S12.

It is recognized that various modifications are possible within the scope of the appended claims.

I claim:
1. An NRZ data phase detector comprising:
phase error means responsive to a data transition for initiating a measuring interval and responsive to a clock transition for terminating said measuring interval, and including means for generating a variable length subinterval between said data transition and a given polarity clock transition and for generating a fixed length subinterval between designated common polarity clock transitions such that said fixed subinterval has a duration of one full clock cycle, the duration difference between said variable subinterval and said fixed subinterval providing phase indication.
2. The invention according to claim 1 wherein:
said fixed subinterval is initiated and terminated by clock transitions of opposite polarity to said given polarity clock transition; and
said variable subinterval is initiated by said data transition and is terminated by said given polarity clock transition.
3. The invention according to claim 1 wherein:
said fixed subinterval is initiated by said given polarity clock transition and is terminated by the imme- diately succeeding clock transition of common polarity; and said variable subinterval is initiated by said data transition and is terminated by said given polarity clock transition initiating said fixed subinterval.

4. An NRZ data phase detector comprising:

first gate means responsive to a data transition for generating a variable duration pulse; and second gate means responsive to clock pulses and to the output of said first gate means for generating a fixed duration pulse between designated clock transitions following said data transition, and for terminating said variable duration pulse upon a given clock transition.

5. The invention according to claim 4 wherein the output of said second gate means is connected to a reset input of said first gate means for terminating said variable duration pulse output by said first gate means concurrently with initiation of said fixed duration pulse output by said second gate means.

6. The invention according to claim 4 comprising reset gate means responsive to clock pulses and to an output of said second gate means for resetting said first gate means at said given clock transition to terminate said variable duration pulse.

7. The invention according to claim 4 comprising reset gate means responsive to clock pulses and to an output of said first gate means and having an output connected to a reset input of said first gate means for terminating said variable duration pulse at said given clock transition following said data transition.

8. An NRZ data phase detector comprising:

a first flip-flop responsive to a data transition for outputting a variable duration pulse;

gate means including a second flip-flop responsive to clock pulses and to the output of said first flip-flop for outputting a fixed duration pulse having a duration of one full clock cycle between designated clock transitions following said data transition, said gate means being also for terminating said variable duration pulse upon a given clock transition.

9. The invention according to claim 8 wherein said first flip-flop has a D input connected to a given logic state, a clock input receiving NRZ data, and wherein said second flip-flop has a D input connected to an output of said first flip-flop, and a clock input receiving said clock pulses, said second flip-flop having an output connected to a reset input of said first flip-flop.

10. The invention according to claim 8 wherein said gate means includes reset gate means receiving clock pulses and an output of said second flip-flop and having an output connected to a reset input of said first flip-flop.

11. The invention according to claim 10 wherein:

said first flip-flop has a D input connected to a given logic state, and a clock input receiving NRZ data;

said second flip-flop has a D input connected to an output of said first flip-flop, and a clock input receiving said clock pulses; and said reset gate means has a first input from an output of said second flip-flop and a second input receiving clock pulses, and an output connected to said reset input of said first flip-flop.

12. The invention according to claim 11 wherein said first flip-flop has a Q output providing said variable duration pulse, said second flip-flop has a Q output providing said fixed duration pulse, and said reset gate means comprises a NOR gate receiving said clock pulses and the $\overline{Q}$ output of said second flip-flop.

13. The invention according to claim 8 wherein said gate means includes reset gate means receiving clock pulses and an output of said first flip-flop and having an output connected to a reset input of said first flip-flop.

14. The invention according to claim 13 wherein:

said first flip-flop has a D input connected to a given logic state, and a clock input receiving NRZ data;

said second flip-flop has a D input connected to an output of said first flip-flop, and a clock input receiving said clock pulses; and said reset gate means comprises a third flip-flop having a D input connected to an output of said first flip-flop, a clock input receiving said clock pulses, a reset input connected to the other output of said first flip-flop, and an output connected to said reset input of said first flip-flop.

15. The invention according to claim 14 wherein said first flip-flop has a Q output providing said variable duration pulse, said second flip-flop has a Q output providing said fixed duration pulse, said Q output of said first flip-flop is connected to the D inputs of said second and third flip-flops, said first flip-flop has a $\overline{Q}$ output connected to said reset input of said third flip-flop, and said third flip-flop has a Q output connected to said reset input of said first flip-flop.

16. In a phase locked loop having an amplifier with first and second input terminals, an NRZ data phase detector comprising:

first gate means responsive to a data transition for generating a variable duration pulse;

second gate means responsive to clock pulses and to the output of said first gate means for generating a fixed duration pulse between designated clock transitions following said data transition, and for terminating said variable duration pulse upon a given clock transition;

said variable and fixed duration pulses being derived directly from said first and second gate means and delivered directly to, respectively, said first and second input terminals of said amplifier means.

17. A detector as defined in claim 8 wherein said first flip-flop has an input connected for directly receiving NRZ data.

* * * * *